United States Patent [19]

Rabeyrolles

[11] Patent Number: 4,692,693

[45] Date of Patent: Sep. 8, 1987

[54] APPARATUS FOR MEASURING LOW CURRENTS WITH HIGH DYNAMICS

[75] Inventor: Serge Rabeyrolles, Cestas, France

[73] Assignee: Commissariat a l'Energie Atomique, Paris, France

[21] Appl. No.: 694,439

[22] Filed: Jan. 24, 1985

[30] Foreign Application Priority Data

Jan. 27, 1984 [FR] France ................ 84 01317

[51] Int. Cl.⁴ .............................. G01R 15/08
[52] U.S. Cl. .............................. 324/123 R; 324/115; 324/132; 340/662
[58] Field of Search ............... 324/99 D, 99 R, 111, 324/113, 115, 123 R, 132, 133; 328/127, 128, 145; 307/264, 492, 493; 340/661, 612; 330/86, 282

[56] References Cited

U.S. PATENT DOCUMENTS

| | | | |
|---|---|---|---|
| 3,483,475 | 12/1969 | Mitchell | 328/145 |
| 3,562,552 | 2/1971 | Baudino et al. | 328/145 |
| 3,714,622 | 1/1973 | Wilhelmsen | 328/128 |
| 4,006,410 | 2/1977 | Roberts | 324/113 |
| 4,136,314 | 1/1979 | Blackmer et al. | 328/145 |
| 4,255,706 | 3/1981 | Soojian | 324/132 |
| 4,558,310 | 12/1985 | McAllise | 340/661 |

FOREIGN PATENT DOCUMENTS 3022196 12/1981 Fed. Rep. of Germany.

OTHER PUBLICATIONS

"Auto-Ranging Voltmeter", by Roberts, Practical Electronics, 2/78, vol. 14, #6, 324-115, pp. 400-406.
Electronique Industrielle (No. 133, May 1970).
Instruments & Experimental Techniques (No. 1/2, Jan.-/Feb. 1977).
Technisches Messen, (No. 4, Apr. 1982).
IBM Technical Disclosure Bulletin (No. 8, Jan. 1983).

Primary Examiner—Reinhard J. Eisenzopf
Assistant Examiner—W. Burns
Attorney, Agent, or Firm—Pearne, Gordon, McCoy & Granger

[57] ABSTRACT

An apparatus for measuring low currents with high dynamics, comprising in series: a multi-range preamplifier, a logarithmic amplifier, a thresholding circuit, an alarm circuit and a reading circuit, the preamplifier comprising in series: a first differential amplifier receiving at its inverting input the low current to be measured and a second amplifier, the first amplifier having a linear feedback chain of very high impedance and the second amplifier having a linear feedback chain of much lower impedence, a zero point adjustment and a circuit for testing the gain of the apparatus being also provided on the first amplifier.

2 Claims, 5 Drawing Figures

APPARATUS FOR MEASURING LOW CURRENTS WITH HIGH DYNAMICS

The invention relates to an apparatus for measuring low currents with high dynamics. The apparatus is adapted to the measurement of currents whose lowest values may be of the order of $10^{-14}$A. Such an apparatus is used more particularly in physics, biology, space research and radiation protection.

To meet requirements in the above listed fields, as a rule a measuring apparatus must enable a high precision measurement to be performed, but it must also cover a wide range. It is therefore necessary to provide a change in sensitivity, but any manual switching thereof is prohibited.

BACKGROUND OF THE INVENTION

The Applicants disclosed such an apparatus in French Patent No. PV 144 111 of Mar. 15, 1968 entitled: "Apparatus for measuring continuous high voltage current with high dynamics".

That apparatus mainly comprises an adapter of symmetrical input and very high impedance, an amplification chain coupled to the output of the adapter and associated with a linear feedback chain and a logarithmic feedback chain comprising at least one first logarithmic element; a second temperature compensating logarithmic element identical with the first one and associated with the amplification chain, a reading device, at the output of the circuits of the amplification chain, at least one threshold circuit coupled to the output of the amplification chain and the input of a range switching members control circuit via a lockout gate whose input is coupled to a delay circuit, and calibrating and shifting elements of the reading device and associated with the amplification chain, the switching members causing at least the switching of the linear feedback chain at the level of the threshold circuit threshold.

It is known to use as the adapter with symmetrical input and high impedance, for measuring apparatuses of the kind specified, a symmetrical assembly of two transistors with insulated control electrodes, associated with two ordinary transistors. Such an assembly is disclosed in Certificate of Addition No. PV 135 544 filed by the Applicants on Jan. 10, 1968 and entitled: "Apparatus for the logarithmic measurement of quantities of charges delivered by an ionization chamber".

FIG. 1 is a diagram illustrating an embodiment of a low current preamplifier according to the teaching of the two Patents cited.

The preamplifier mainly comprises an impedance adapter 2, an amplifier 4 and a symmetrical stage of two transistors 6, to ensure an adequate output current. The preamplifier receives at the input the low current to be measured coming, for example, from an ionization chamber. The current is, for example, between $10^{-14}$ and $10^{-11}$A. The output current delivered by the amplifier is of the order of 5 mA.

The impedance adapter 2 is protected at the input by an assembly 10 of diodes and a network RC comprising a high value resistor 12 and a capacitor 14. Because of its symmetrical structure, the impedance adapter 2 is temperature-stable.

It is difficult to amplify a very low input current. This requires an impedance adapter 2 having the lowest possible leakage current (low current to be measured), and a feedback chain 8 of high precision and high stability. The non-inverting input of the amplifier has a means 18 for zero point adjustment of the amplifier 4 in the absence of an input signal ("offset" control).

The feedback chain 8 of the amplifier comprises two paths in parallel of different sensitivity. The value of the resistance of each path determines the gain of the preamplifier. The path of higher sensitivity comprises a very high value resistor 20. The path of lower sensitivity comprises a resistor 22 of lower value, for example, at least 100 times lower. Capacitors 24 and 26 are disposed in parallel with the resistors. The lowest sensitivity is obtained by connecting the two paths in parallel. This is done by a switch 28 controlled by a high insulation relay 30.

It is an object of the invention to improve the measuring apparatus disclosed in the French Patent cited hereinbefore. This improvement relates mainly to the preamplifier of the measuring apparatus.

BRIEF STATEMENT OF THE INVENTION

More precisely, the apparatus for measuring low currents with high dynamics according to the invention comprises a linear preamplifier, a logarithmic amplification means receiving the signal delivered by the preamplifier, an alarm means which triggers an alarm signal when the signal delivered by the logarithmic amplification means is higher than a given level, and a means for reading the signal delivered by the logarithmic amplification means.

In the apparatus the preamplifier comprises in series: a first differential amplifier receiving at its inverting input the low current to be measured and a second amplifier, the first amplifier having a linear feedback chain of very high impedance, the second amplifier having a linear feedback chain of much lower impedance, a zero point adjustment means and a means of controlling the general gain of the apparatus being also provided on the first amplifier.

The majority of the gain of the preamplifier is obtained by the first amplifier. The gain contributed by the second amplifier is only of the order of a few units. However low it may be, this allocation of a proportion of the gain to a second amplifier is important, since in the prior art low current measuring apparatuses, the amplifier is on its own, and operates to the limit of its performance. This results more particularly in a relatively considerable current leakage. In the apparatus according to the invention on the contrary the allocation of a proportion of the gain to the second amplifier enables the stresses on the input amplifier to be reduced, thus contributing towards limiting the leakage current.

According to an important feature of the apparatus according to the invention the feedback chain of the first amplifier comprises a range of impedances switched by a thresholding means receiving at its input a signal delivered by the logarithmic amplification means.

According to another feature of the apparatus according to the invention, the zero point adjustment means comprises a precontrolling means and a fine adjustment means which fixes the potential applied to the non-inverting input of the first amplifier.

According to another feature of the apparatus according to the invention, the first amplifier is supplied with a voltage lower than the rated voltage.

DESCRIPTION OF DRAWINGS

The features and advantages of the invention will be gathered more clearly from the following illustrative, non-limiting description with reference to the accompanying drawings, wherein.

DETAILED DESCRIPTION OF PREFERRED EMBODIMENTS

Figure 2:
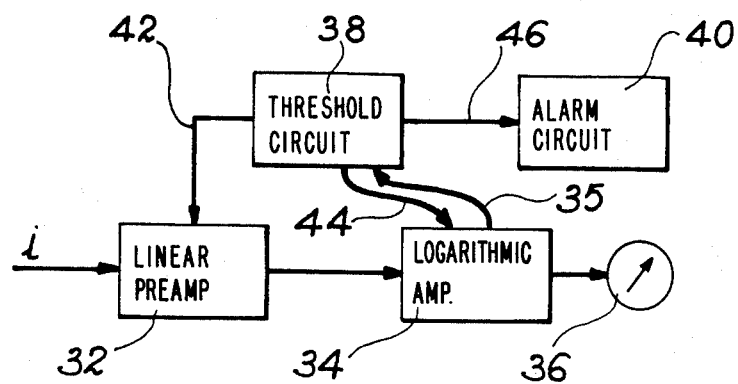
FIG. 2 shows diagrammatically the measuring apparatus according to the invention.

FIG. 2 is an overall drawing of the measuring apparatus according to the invention, comprising a preamplifier 32, a logarithmic amplification means 34, a reading means 36, a thresholding means 38 and an alarm means 40.

The preamplifier 32 receives the low current i to be amplified. It delivers a voltage signal proportional to the current i. The signal is applied to the input of the logarithmic amplification means 34, which delivers a voltage signal proportional to the logarithm of the current of the signal received. The signal is delivered to the reading means 36, and a proportional signal is delivered to the thresholding means 38 via connection 35. This thresholding means ensures a comparison between the signal delivered by the logarithmic amplification means 34 and a reference level determining the triggering of the alarm. This means also has a double-threshold circuit which enables the automatic change of range of the feedback chain of the preamplifier 32 to be controlled via connection 42. The shifting of the gain of the logarithmic amplification means is simultaneously performed by a control signal delivered over connection 44.

The alarm means 40 triggers an alarm on the reception of a signal received from the thresholding means 38 via connection 46. The alarm means can also comprise means checking the correct operation of the apparatus (supply, . . . ). The alarm triggered can be audible and/or visual. It can be immediate or delayed.

Figure 3:
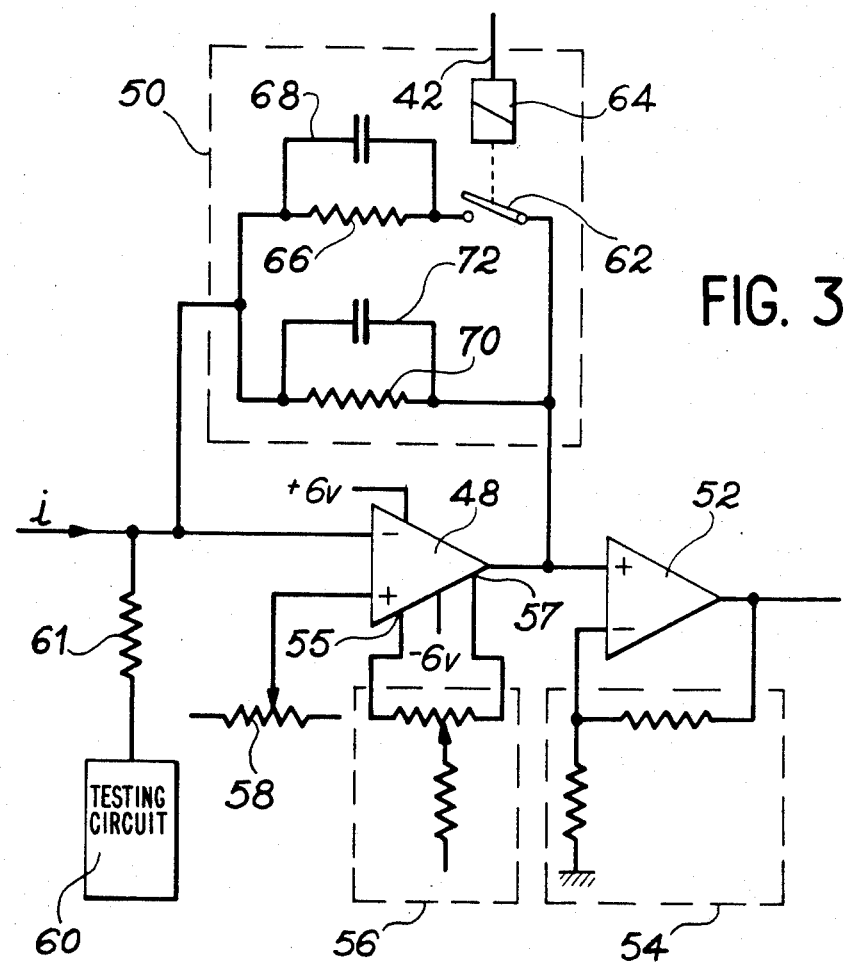
FIG. 3 shows an embodiment of the preamplifier of the apparatus according to the invention.

The preamplifier (FIG. 3) mainly comprises a first differential amplifier 48 of very low leakage current having a linear feedback chain 50 of very high impedance and a second amplifier 52 having a linear feedback chain 54. A zero point adjustment means 56 and a fine zero adjustment means 58 are also provided on the differential amplifier 48.

The gain in voltage of the second amplifier is of the order of a few units, for example, 2. The majority of gain of the preamplifier is supplied by the first amplifier, which receives a current of $10^{-14}$ to $10^8 A$ and deliveres a voltage signal which can amount to several volts.

Finally, the preamplifier comprises a testing means 60 enabling the gain of the apparatus to be checked. The means 60 injects a calibrated current via resistor 61 into the inverting input of the amplifier 48. The gain is checked by reading the means 36 (FIG. 2).

By way of example, the amplifier ICH8500A of INTERSIL can be used as the amplifier 48.

Lastly, to limit the leakage current at the input, it may seem useful to undersupply the first amplifier. This is possible, for a fixed gain of the preamplifier, only if the second amplifier makes up the gain lost by the first amplifier because of such under-supply.

The low current to be amplified is received at the inverting input of the differential amplifier 48, which delivers a voltage signal at the output.

The gain of this amplifier is a function of the feedback chain 50. Having regard to the low level of the current signal received by the amplifier, the impedance of the chain 50 must be very considerable for the voltage signal delivered by the amplifier 48 to have a level of several volts. The impedance of the chain 50 is therefore, for example, at least $10^{10}$ ohms.

The differential amplifier 52 receives the voltage signal delivered by the amplifier 48 at its non-inverting input. It comprises a feedback chain 54 which determines its gain. The impedance of the chain 54 is very much lower than the impedance of the chain 50, since the amplifier 52 essentially acts as a buffer between the output of the amplifier 48 and the other downstream means of the measuring apparatus.

Figure 1:
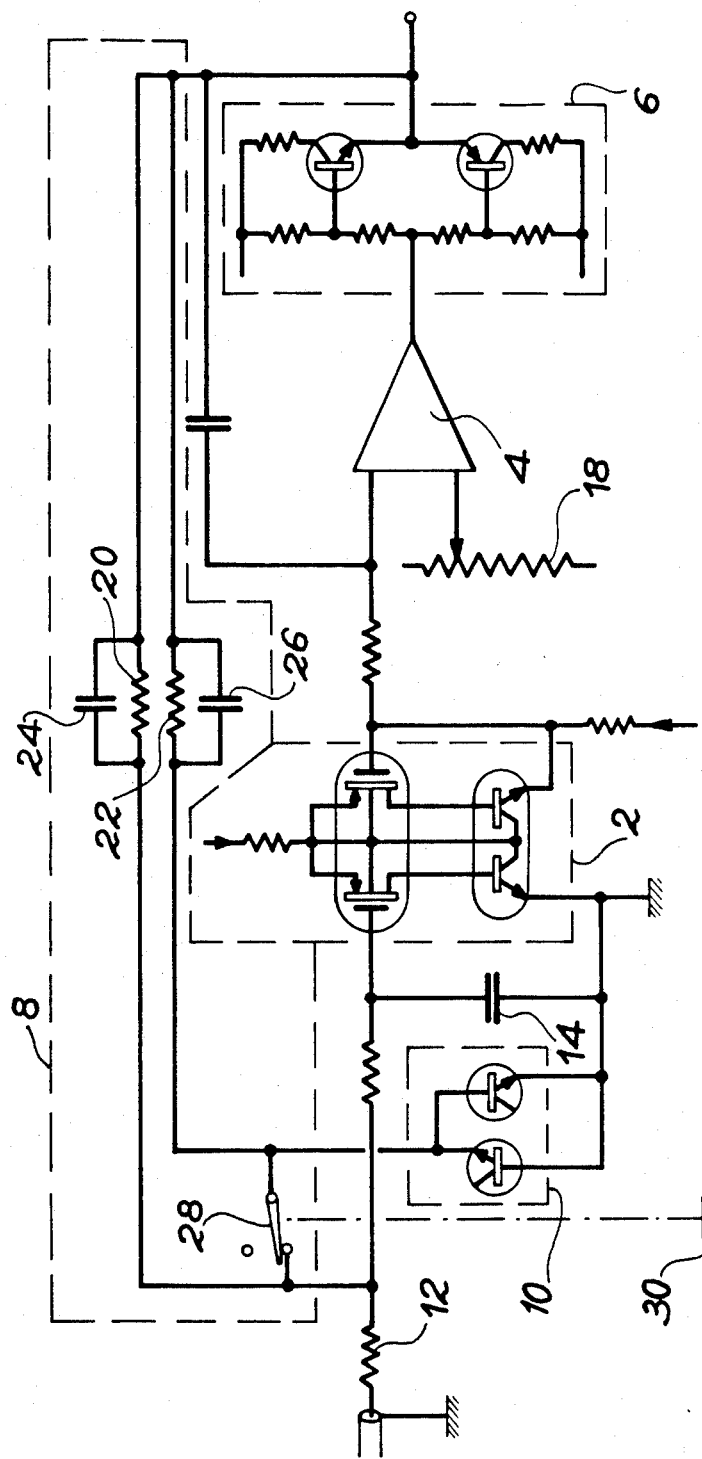
FIG. 1, already described, shows diagrammatically an embodiment of the preamplifier of a prior art low current measuring apparatus.

The zero point adjustment of the amplifier 48 differs from the zero point adjustment of the amplifier shown in FIG. 1. It comprises a first control means 56, which can be precontrolled, for example, in the construction of the preamplifier, and an adjusting means 58 which is accessible to the user and allows precision zero point adjustment. The control means 56 is disposed between the adequate terminals 55 and 57 of the amplifier 48. The adjusting means 58 is connected to the non-inverting input of the amplifier 48.

To make this zero point adjustment possible, the amplifier 52 must have a very low offset voltage, for example, lower than 100 $\mu V$. By way of example, use can be made of the amplifier 0P07 DH of Analog Devices.

The gain of the assembly is checked by a testing means 60 which delivers a reference voltage. This means is connected to the inverting input of the amplifier 48 via a resistor 61 of very high value and a high insulation relay.

The feedback chain 50 of the amplifier 48 comprises a range of impedance, each formed by a resistor of very high value and possibly a capacitor in parallel. The feedback chain 50 in the drawing comprises two resistors 66 and 70 and two capacitors 68 and 72. The relation between the values of the two resistors is considerable, for example, higher than 100.

The two impedances are disposed in parallel and a switch 62 is disposed in series with the resistor 66 of lower value. The switch is actuated by a relay 64 controlled by the thresholding means of the apparatus via the connection 42.

Figure 4:
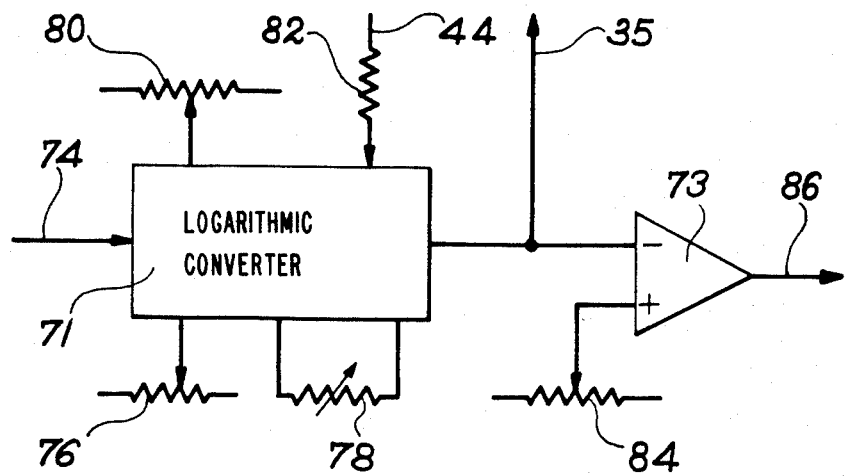
FIG. 4 shows an embodiment of the logarithmic amplification means of the apparatus according to the invention.

FIG. 4 shows an embodiment of the logarithmic amplification means of the measuring apparatus. It mainly comprises a logarithmic converter 71 and a reading amplifier 73.

The signal delivered by the preamplifier shown in the preceding figure is received via connection 74 by logarithmic converter 71. The latter comprises adjustment means, such as a zero point adjustment means 76, a gain control means 78, a means 80 for controlling the first range, corresponding to the highest resistance of the feedback chain, and a means 82 for delivering a shift current for the second range, such means being connected to the connection 44 coming from the thresholding means.

The signal delivered by the logarithmic converter 71 is delivered to the thresholding means via connection 35. In dependence on the level of the signal, the thresholding means switches the range of impedance of the preamplifier to low or high sensitivity.

The signal delivered by the logarithmic converter 71 is also applied to the inverting input of a reading amplifier 73 which comprises a zero point adjustment means 84 at its non-inverting input and which delivers a signal to the reading means via connection 86.

Figure 5:
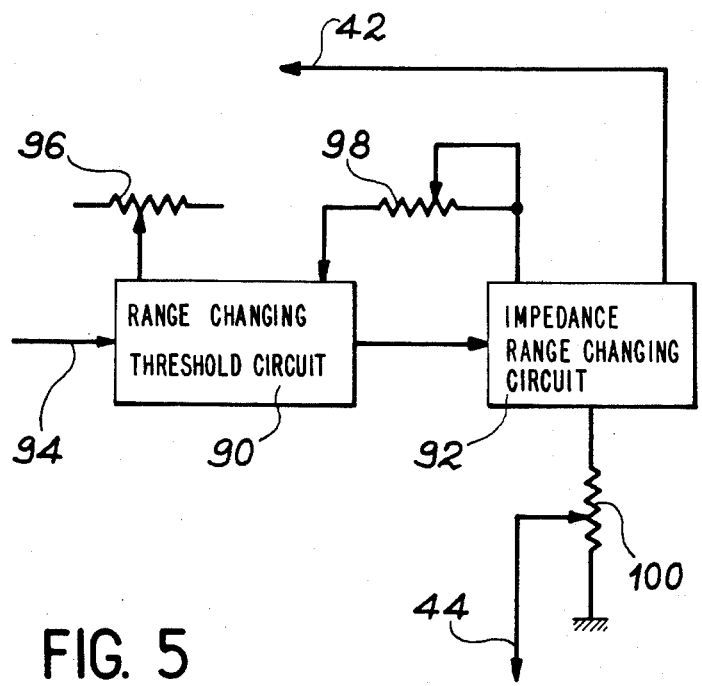
FIG. 5 shows an embodiment of the thresholding means of the apparatus according to the invention.

By way of example, the Applicants embodied the logarithmic amplification means shown in FIG. 5 by using as the logarithmic converter the circuit 4127 JG of Burr Brown, and as reading amplifier the circuit LM 301N of National Semiconductor.

FIG. 5 shows an embodiment of the thresholding means of the measuring apparatus. It comprises a range-changing threshold circuit 90 mounted as a double-threshold comparator, and a range-changing control circuit 92.

The circuit 90 receives the signal delivered by the logarithmic amplifier 34 (see FIG. 2) via connection 94. It comprises a low threshold level indicating means 96 and a high threshold level indicating means 98. The circuit 92 controls the impedance range changing relay of the preamplifier via connection 42 and delivers in a resistor 100 of connection 44 a signal to the logarithmic amplification means.

What we claim is:

1. An apparatus for measuring low electric currents with high dynamics comprising:
   (a) a linear preamplification having an input for receiving a low current signal and an output providing a voltage signal, said linear preamplifier comprising:
      (1) a first differential amplifier having an inverting input, a non-inverting input and an output, said low current signal being applied to said inverting input;
      (2) a first feedback chain comprising a plurality of impedance groups, each of said groups being connectable between said output and said inverting input of said first differential amplifier, each of said groups comprising in series a switch and an impedance element, said switch being connectable to said output, and said impedance element being connectable to said inverting input;
      (3) means for controlling each switch of said impedance groups;
      (4) a zero point adjustment means for adjusting an offset of said preamplifier, comprising a first preset control means connected to said first differential amplifier, and a fine adjustment means connected to the non-inverting input of said differential amplifier;
      (5) a testing means for testing a gain of said first differential amplifier, said testing means being connectable to the inverting input of said first differential amplifier;
      (6) a second differential amplifier having an inverting input, a non-inverting input and an output constituting said preamplifier output, said non-inverting input being connected to said output of said first differential amplifier, and said second differential amplifier output delivering said voltage signal; and
      (7) a second feedback chain comprising a first resistor connected between the inverting input and the output of said second differential amplifier, and a second resistor connected between earth ground and the inverting input of said second differential amplifier, said second feedback chain having an impedance substantially lower than the said first feedback chain of said first differential amplifier;
   (b) a logarithmic amplifier having an input connected to the output of said linear preamplifier, and a logarithmic amplifier output supplying an amplified voltage signal, said logarithmic amplifier including a gain control input;
   (c) a thresholding means having an input for receiving the amplified voltage signal supplied by said logarithmic amplification means and supplying, as a function of said amplified voltage signal:
      (1) a control signal for controlling the said switches of the impedance groups of the first feedback chain of said first differential amplifier,
      (2) an alarm signal when a level of said amplified voltage signal is higher than a predetermined level, and
      (3) a gain control signal to the gain control input of said logarithmic amplification means;
   (d) an alarm means receiving said alarm signal and triggering an alarm as a function of said alarm signal; and
   (e) a reading means for displaying the amplified voltage signal supplied by said logarithmic amplifier.

2. An apparatus according to claim 1 having a power supply input for receiving a rated power voltage signal wherein a power voltage signal applied is lower than said rated power voltage signal.

* * * * *